United States Patent
Kondoh et al.

(10) Patent No.: US 10,134,619 B2
(45) Date of Patent: Nov. 20, 2018

(54) CONNECTING MECHANISM AND CONNECTING METHOD OF SUBSTRATE CONTAINER

(71) Applicant: TOKYO ELECTRON LIMITED, Tokyo (JP)

(72) Inventors: Keisuke Kondoh, Yamanashi (JP); Norihiko Tsuji, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 106 days.

(21) Appl. No.: 15/423,483

(22) Filed: Feb. 2, 2017

(65) Prior Publication Data

US 2017/0221743 A1 Aug. 3, 2017

(30) Foreign Application Priority Data

Feb. 2, 2016 (JP) ................................. 2016-017628

(51) Int. Cl.
*H01L 21/673* (2006.01)
*H01L 21/677* (2006.01)

(52) U.S. Cl.
CPC .. *H01L 21/67389* (2013.01); *H01L 21/67376* (2013.01); *H01L 21/67379* (2013.01); *H01L 21/67393* (2013.01); *H01L 21/67772* (2013.01); *H01L 21/67775* (2013.01)

(58) Field of Classification Search
CPC ......... H01L 21/67389; H01L 21/67775; H01L 21/67772; H01L 21/67393; H01L 21/67379; H01L 21/67376
See application file for complete search history.

(56) References Cited

U.S. PATENT DOCUMENTS

| 5,169,272 | A | * | 12/1992 | Bonora | G03F 7/7075 414/217.1 |
| 5,433,574 | A | * | 7/1995 | Kawano | B01L 1/04 414/217 |
| 5,586,585 | A | * | 12/1996 | Bonora | H01L 21/67772 141/1 |
| 6,152,669 | A | * | 11/2000 | Morita | H01L 21/67772 414/217 |
| 8,936,050 | B2 | * | 1/2015 | Sugawara | H01L 21/67772 141/64 |
| 9,010,384 | B2 | * | 4/2015 | Yoshimura | H01L 21/67772 141/63 |

(Continued)

FOREIGN PATENT DOCUMENTS

JP 2015-146349 8/2015

*Primary Examiner* — Nicholas A Arnett (57) ABSTRACT

A connecting mechanism includes a mounting unit, a substrate transfer port, a door closing or opening the substrate transfer port, a coupling mechanism coupling a cover of the substrate container mounted on the mounting unit with the door, and a gas exhaust/purge unit. First, second and third seal members respectively seal a first space between a peripheral portion of the substrate transfer port and the door, a second space between the door and the cover of the substrate container, and a space between the peripheral portion of the substrate transfer port and the main body. The gas exhaust unit exhausts the first space and a second space. The purge gas, which has been supplied into the substrate container by the gas exhaust/purge unit, is supplied into the first and the second space by allowing the gas exhaust unit to exhaust the first and the second space.

10 Claims, 12 Drawing Sheets

(56) References Cited

U.S. PATENT DOCUMENTS

| | | | |
|---|---|---|---|
| 9,082,807 B2* | 7/2015 | Sugawara | H01L 21/68735 |
| 9,330,950 B2* | 5/2016 | Wakabayashi | H01J 37/32743 |
| 9,824,907 B2* | 11/2017 | Igarashi | H01L 21/67393 |
| 9,887,115 B2* | 2/2018 | Wakabayashi | H01L 21/67772 |
| 2004/0055650 A1* | 3/2004 | Inoue | H01L 21/67772 |
| | | | 137/565.23 |
| 2008/0236487 A1* | 10/2008 | Hirano | H01L 21/67017 |
| | | | 118/715 |
| 2011/0210041 A1* | 9/2011 | Okabe | H01L 21/67393 |
| | | | 206/710 |
| 2015/0170945 A1 | 6/2015 | Segawa et al. | |
| 2016/0147235 A1* | 5/2016 | Rice | H01L 21/67775 |
| | | | 700/282 |
| 2017/0178942 A1* | 6/2017 | Sakata | H01L 21/67778 |

* cited by examiner

CONNECTING MECHANISM AND CONNECTING METHOD OF SUBSTRATE CONTAINER

CROSS-REFERENCE TO RELATED APPLICATIONS

This application claims priority to Japanese Patent Application No. 2016-017628 filed on Feb. 2, 2016, the entire contents of which are incorporated herein by reference.

FIELD OF THE INVENTION

The disclosure relates to a connecting mechanism and a connecting method for connecting a sealed type substrate container for accommodating and transferring a plurality of substrates to a normal pressure transfer chamber.

BACKGROUND OF THE INVENTION

Conventionally, in a semiconductor manufacturing process, a plurality of processes such as heat treatment, film formation, etching and the like is performed on a semiconductor wafer (hereinafter, simply referred to as "wafer") that is a target substrate. Recently, along with a trend toward high integration or miniaturization of semiconductor devices, in order to prevent adhesion of particles to the wafer or oxidation of a surface of the wafer, the wafer is transferred while being accommodated in a sealed type container referred to as a FOUP (Front-Opening Unified Pod) maintained under a clean atmosphere. The FOUP includes a main body for accommodating a plurality of wafers in a horizontal state and a cover for opening/closing the main body.

A substrate processing system for performing a predetermined process on a wafer includes a wafer transfer chamber of an atmospheric pressure (normal pressure) which is referred to as an EFEM (Equipment Front End Module). The wafer transfer chamber is provided at a loading side of the substrate processing system. A wafer is transferred between the FOUP and a processing apparatus of the substrate processing system by a transfer unit in the EFEM.

The EFEM includes a load port for loading a wafer. The FOUP is mounted on the load port. The load port has a door designed based on FIMS (Front-opening Interface Mechanical Standard). When the door moves while being connected to the cover provided at the FOUP, a space in the FOUP communicates with a space in the EFEM and the wafer can be delivered therebetween.

Recently, along with the trend toward high integration or miniaturization of semiconductor devices, the effect from moisture, oxygen, particles or the like in the EFEM needs to be minimized. Therefore, there is suggested a technique for circulating nitrogen gas as a purge gas in the EFEM (see Japanese Patent Application Publication No. 2015-146349).

In the technique for circulating nitrogen gas, which is disclosed in Japanese Patent Application Publication No. 2015-146349, it is required to set the interior of the EFEM to an extremely clean nitrogen atmosphere. Therefore, it is required to prevent inflow of oxygen gas or moisture and particles from the load port or from the FOUP.

SUMMARY OF THE INVENTION

In view of the above, the disclosure provides a connecting method and a connecting mechanism of a substrate container, which can suppress inflow of oxygen gas or moisture and particles into a normal pressure transfer chamber having a structure for circulating a purge gas such as nitrogen or the like from the substrate container or a connecting part when the substrate container is connected to the normal pressure transfer chamber.

In accordance with an aspect, there is provided a connecting mechanism for a substrate container including a main body for accommodating a plurality of substrates and a cover for opening/closing an opening of the main body, which connects the substrate container to a normal pressure transfer chamber in which a purge gas circulates and which is configured to transfer a substrate to a processing unit for processing a substrate. The connecting mechanism includes: a mounting unit configured to mount thereon the substrate container; a substrate transfer port provided at a wall of the normal pressure transfer chamber; a door configured to close the substrate transfer port and open the substrate transfer port by moving toward the normal pressure transfer chamber side; a coupling mechanism configured to couple the cover of the substrate container mounted on the mounting unit with the door; a gas exhaust/purge unit configured to exhaust the substrate container while supplying a purge gas into the substrate container in a state where the substrate container is coupled with the door; a first seal member configured to seal a first space between a peripheral portion of the substrate transfer port and the door when the door closes the substrate transfer port; a second seal member configured to seal a second space between the door and the cover of the substrate container when the substrate container is coupled with the door; a third seal member configured to seal a third space between the peripheral portion of the substrate transfer port and the main body of the substrate container when the substrate container is coupled with the door; and a gas exhaust unit configured to exhaust the first space and the second space which are sealed by the first to the third seal member. The purge gas, which has been supplied into the substrate container by the gas exhaust/purge unit, is supplied into the first and the second space by allowing the gas exhaust unit to exhaust the first and the second space.

In accordance with another aspect, there is provided a connecting method for a substrate container including a main body for accommodating a plurality of substrates and a cover for opening/closing an opening of the main body, which connects the substrate container to a normal pressure transfer chamber in which a purge gas circulates and which is configured to transfer a substrate to a processing unit for processing a substrate. A substrate transfer port provided at a wall of the normal pressure transfer chamber is closed by a door; the cover of the substrate container is coupled with the door; a space between a peripheral portion of the substrate transfer port and the door is sealed, a space between the door and the cover of the substrate container is sealed and a space between the peripheral portion of the substrate transfer port and the main body of the substrate container is sealed; the substrate container is exhausted while supplying a purge gas into the substrate container in a state where the substrate container is coupled with the door; and the purge gas which has been supplied into the substrate container is supplied into the sealed spaces by exhausting the sealed spaces.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings.

Substrate Processing System

Figure 1:
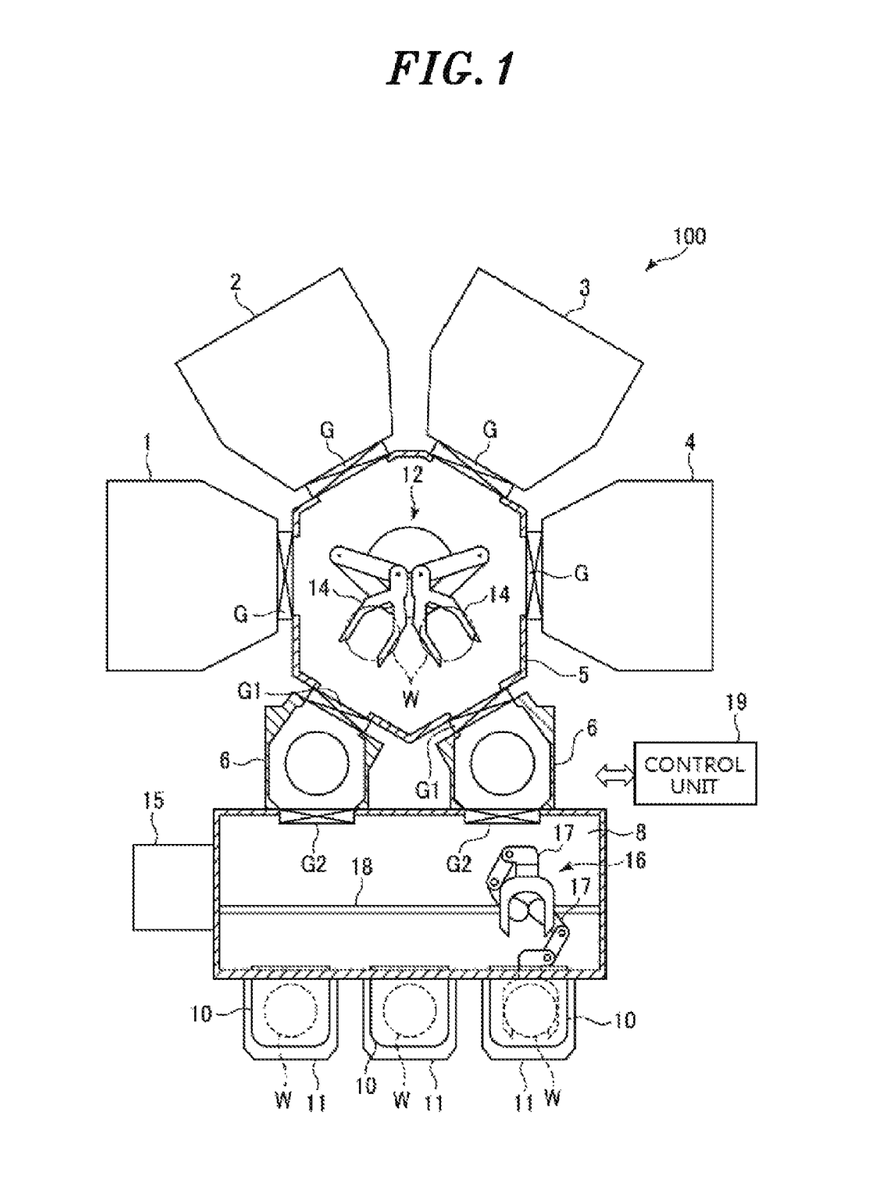
FIG. 1 is a horizontal cross sectional view schematically showing a multi-chamber type substrate processing system including a connecting mechanism according to an embodiment.

FIG. 1 is a horizontal cross sectional view schematically showing a multi-chamber type substrate processing system including a connecting mechanism according to an embodiment.

A substrate processing system 100 performs predetermined vacuum processing such as film formation or the like on a wafer that is a target substrate.

As shown in FIG. 1, the substrate processing system 100 includes four processing units 1 to 4 for performing vacuum processing on the wafer W. The processing units 1 to 4 are provided at walls corresponding to four sides of a hexagonal vacuum transfer chamber 5. Each of the processing units 1 to 4 performs a predetermined process on the wafer W mounted on a mounting plate. Two Load-lock chambers 6 are respectively connected to the other walls of the vacuum transfer chamber 5.

A normal pressure transfer chamber 8 configured as an EFEM is provided opposite to the vacuum transfer chamber 5 with respect to the two load-lock chambers 6 and connected to the two load-lock chambers 6.

Three load ports 11 are provided opposite to the load-lock chambers 6 with respect to the normal pressure transfer chamber 8. A FOUP 10 which is a container for wafers W is mounted on the load port 11 and is connected thereto. A dry purge gas, e.g., nitrogen gas ($N_2$ gas) is supplied to circulate in the normal pressure transfer chamber 8. A fan filter unit is provided at an upper portion of the normal pressure transfer chamber 8 to supply a clean purge gas as downflow to a wafer transfer region. As for the purge gas, another inert gas such as Ar gas or the like may be used. However, it is preferable to use $N_2$ gas.

As shown in FIG. 1, the processing units 1 to 4 are connected to the corresponding walls of the vacuum transfer chamber 5 through gate valves G, respectively. By opening the gate valves G, the processing units 1 to 4 communicate with the vacuum transfer chamber 5. By closing the gate valves G, the processing units 1 to 4 are isolated from the vacuum transfer chamber 5. The two load-lock chambers 6 are respectively connected to the other walls of the vacuum transfer chamber 5 through gate valves G1 and also respectively connected to the normal pressure transfer chamber 8 through gate valves G2.

Provided in the vacuum transfer chamber 5 is a transfer unit 12 for loading/unloading the wafer W into/from the processing units 1 to 4 and the load-lock chambers 6. The transfer unit 12 is configured to transfer wafers W individually by using two multi-joint arms 14. The vacuum transfer chamber 5 is exhausted by a vacuum pump (not shown) and maintained at a predetermined vacuum level.

An alignment chamber 15 is provided at a side surface of the normal pressure transfer chamber 8. The wafer W is aligned in the alignment chamber 15.

Provided in the normal pressure transfer chamber 8 is a transfer unit 16 for transferring wafers W to the load-lock chambers 6 and to the FOUPs 10 connected to the load ports 11. The transfer unit 16 has two multi-joint arms 17. The two multi-joint arms 17 can move along a rail 18 in an arrangement direction of the FOUPs 10. The wafers W are transferred by the multi-joint arms 17.

The substrate processing system 100 further includes a control unit 19. The control unit 19 includes a computer having a CPU or a storage unit. The control unit 19 is configured to control the respective components of the substrate processing system 100, e.g., the processing units 1 to 4, the transfer chamber 5, the gas supply system or the gas exhaust system in the load-lock chambers 6, the transfer units 12 and 16, the gate valves and the like. The storage unit stores a control program, i.e., a processing recipe, for sending instructions to the respective components to perform a predetermined film forming process by the film forming apparatus 1, various database or the like. The processing recipe or the like is stored in a storage medium. The storage medium may be a hard disk in a computer, or may be a portable device such as a CDROM, a DVD, a semiconductor memory or the like. Alternatively, the processing recipe or the like may be transmitted from another device through a dedicated line.

In the substrate processing system 100 described above, the FOUP 10 accommodating wafers is mounted on the load port 11 and a wafer W is unloaded therefrom by the transfer unit 16. The wafer W is transferred to the alignment chamber 15 through the normal pressure transfer chamber 8 and subjected to alignment. Next, the wafer W is transferred to one of the load-lock chambers 6. After the load-lock chamber 6 is evacuated, the wafer W is transferred to one of the processing units 1 to 4 by the transfer unit 12 and subjected to a predetermined processing such as film formation or the like. Upon completion of the processing, the wafer W is transferred to one of the load-lock chambers 6. A pressure in the load-lock chamber 6 is returned to an atmospheric pressure and, then, the wafer W is returned to the FOUP 10 by the transfer unit 16.

Foup

Hereinafter, the FOUP 10 that is a wafer container will be described.

Figure 2:
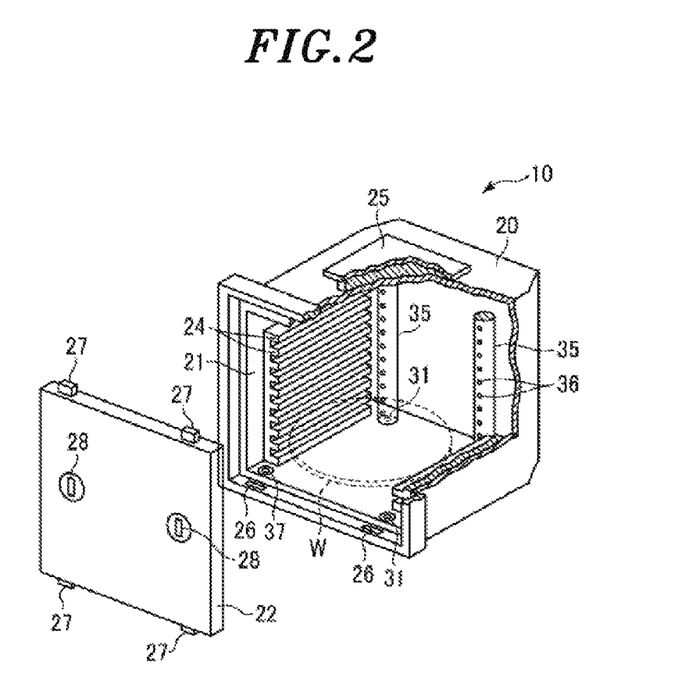
FIG. 2 is a partially cutout perspective view showing a FOUP that is a wafer container.
Figure 3:
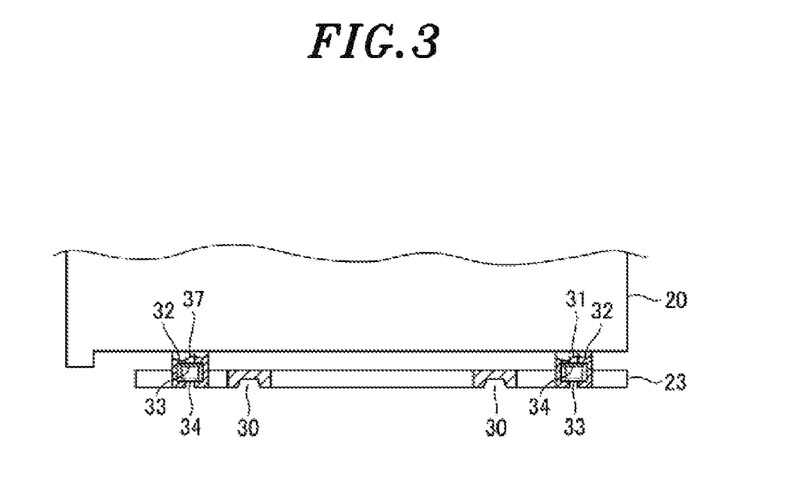
FIG. 3 is a cross sectional view showing a bottom portion of the FOUP.

FIG. 2 is a partially cutout perspective view of the FOUP 10. FIG. 3 is a cross sectional view showing a bottom portion of the FOUP 10.

The FOUP 10 includes a main body 20, a flat plate-shaped cover 22 for maintaining airtightness of the main body 20 by blocking a loading/unloading opening 21 for the wafer W which is formed at a front side of the main body 20, and a flat plate-shaped leg portion 23 (see FIG. 3) for supporting the main body 20. A support portion (slot) 24 for supporting a peripheral portion of a backside of the wafer W is provided at multiple levels at a right and a left portion inside the main body 20. A plurality of, e.g., 25, wafers W are supported by the right and the left support portions 24 corresponding to each other. Provided at an upper portion of the main body 20 is a grip portion 25 to be gripped by a transfer unit for transferring a FOUP, for example. A clamp groove 25a into which a clamp member is inserted is formed at the grip portion 25 (see FIG. 5 to be described below). Two coupling grooves 26 are respectively formed at a right and a left area of each of an upper and a lower portion of an inner periphery of an edge of the loading/unloading opening 21 (only those formed at the lower portion are illustrated).

Two rotatable parts (not shown) are provided in parallel at a right and a left portion inside the cover 22. Linearly moving parts 27 extending in a vertical direction are respectively connected to upper and lower portions of the rotatable parts. The linearly moving parts 27 are switched by the rotation of the rotatable parts between an upwardly and downwardly projected state illustrated in the drawing and an inwardly retreated state. When the leading ends of the linearly moving parts 27 protrude in a state where the loading/unloading opening 21 is blocked by the cover 22, the leading ends thereof are respectively coupled with the coupling grooves 26 of the main body 20 and a locking state in which the cover 22 is coupled with the main body 20 is obtained. Key holes 28, into which latch keys to be described later are inserted, are formed in parallel at a right and a left portion of a front surface of the cover 22. The rotatable parts are rotated by the rotation of the latch keys.

Three recesses 30 to be fitted with kinematic pins to be described later are formed at a bottom surface of the leg portion 23. Two recesses are formed at a front side and one recess is formed at a rear side (only two recesses formed at the front side and the rear side are illustrated in FIG. 3).

As shown in FIG. 3, three gas supply inlets 31 are provided at a bottom surface of the main body 20. The gas supply inlets 31 are provided at a right and a left end portion of the rear side of the main body 20 and at a left end portion of the front side of the main body 20. Further, the gas supply inlets 31 penetrate through the bottom portion of the main body 20 and the leg portion 23. Each of the gas supply inlets 31 is provided with a check valve 32. The check valve 32 has a valve body 33. The gas supply inlet 31 is closed by restoration force of a spring installed at the valve body 33. When a pressure below the valve body 33 is increased, the valve body 33 opens the gas supply inlet 31 against the restoration force of the spring. A filter 34 for removing particles in gas is provided above the valve body 33.

As shown in FIG. 2, two gas supply inlets 31 are provided at the rear side in the main body 20 when seen from the loading/unloading opening 21 to the main body 20. Each of the two gas supply inlets 31 is provided with a gas nozzle 35 extending upwardly. Injection holes 36 for injecting a purge gas toward the wafers W are formed at the gas nozzle 35 at height positions corresponding to heights of top surfaces of the wafers W supported by the support portions 24.

As shown in FIG. 3, a gas exhaust outlet 37 is provided at a right front side of the bottom surface of the main body 20. The gas exhaust outlet 37 includes a check valve 32 having an upside-down shape of the check value 32 provided at the gas supply inlet 31. The check valve 32 in the gas exhaust outlet 37 is opened when a pressure in the FOUP 10 becomes higher than an external pressure.

Load Port

Hereinafter, the load port 11 that is a connecting mechanism for connecting the FOUP that is a wafer container to the normal pressure transfer chamber 8 will be described.

Figure 4:
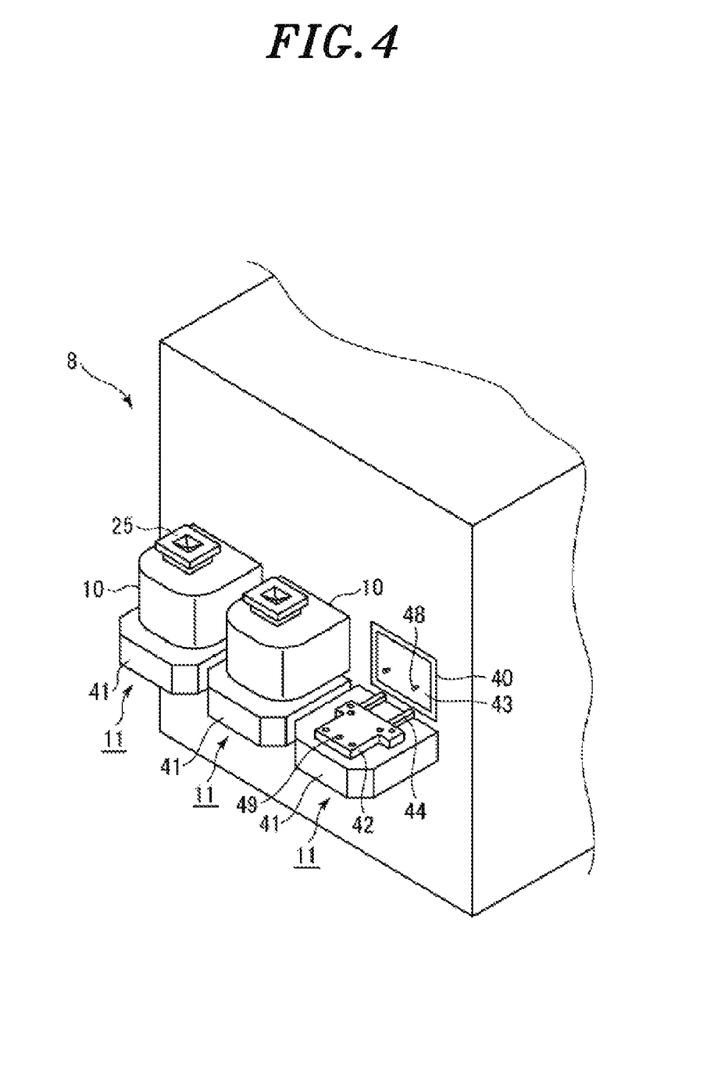
FIG. 4 is a perspective view showing a load port as the connecting mechanism according to the embodiment.
Figure 5:
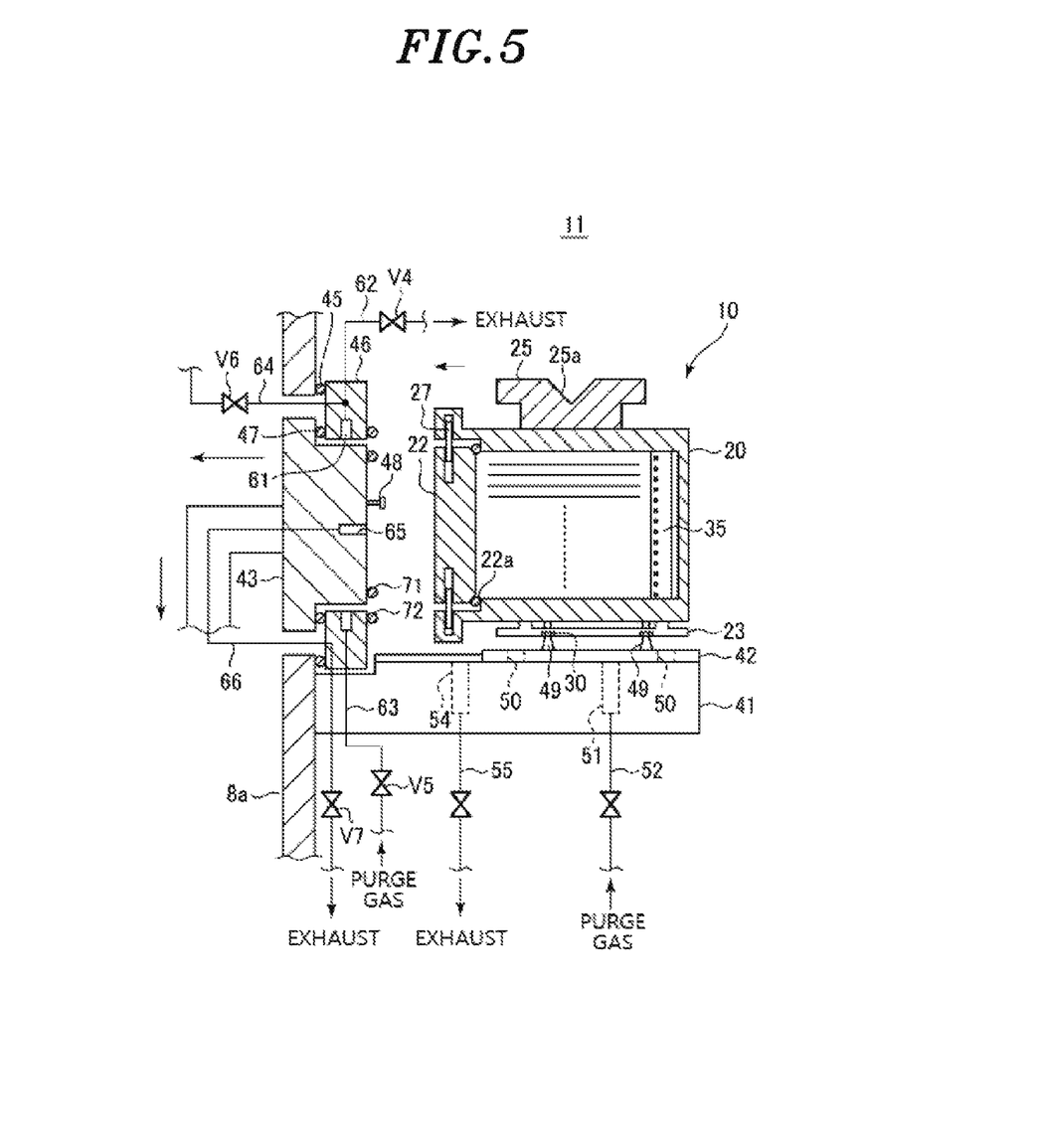
FIG. 5 is a vertical cross sectional view showing the load port shown in FIG. 4.
Figure 6:
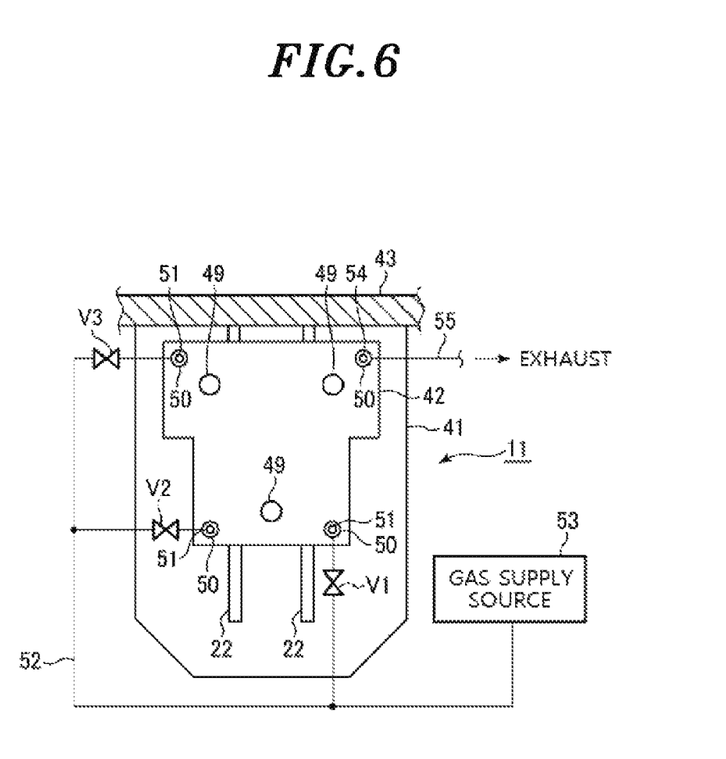
FIG. 6 is a top view showing the load port shown in FIG. 4.
Figure 7:
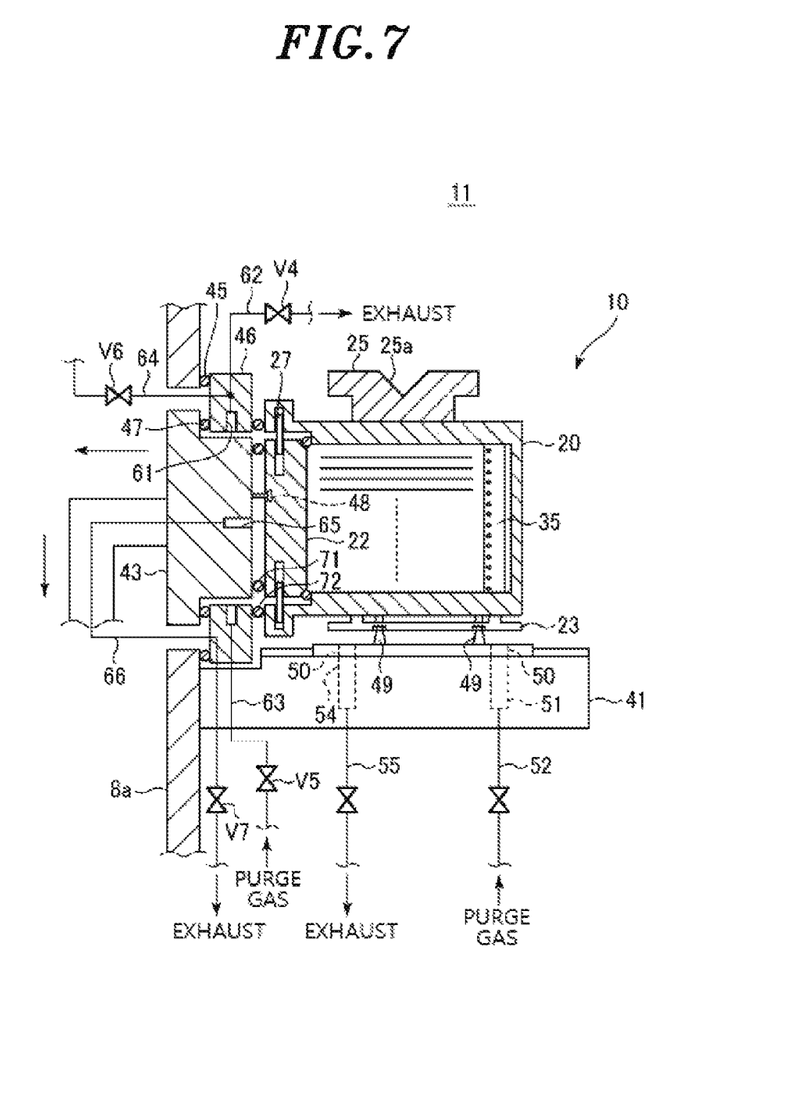
FIG. 7 is a vertical cross sectional view showing a state in which the FOUP is docked to the load port shown in FIG. 4.

FIG. 4 is a perspective view of the load port 11. FIG. 5 is a vertical cross sectional view of the load port 11. FIG. 6 is a top view of the load port 11. FIG. 7 is a vertical cross sectional view showing a state in which the FOUP 10 is docked to the load port 11. As shown in FIG. 4, each of the three load ports 11 includes a wafer transfer port (substrate transfer port) 40, a base 41, a stage (mounting stage) 42 for mounting thereon the FOUP 10, and a door 43 for opening/closing the wafer transfer port 40. The stage 42 is configured to move forward and backward along a rail 44 extending in a forward/backward direction by a stage moving unit (not shown). Due to the forward/backward movement of the stage 42, the FOUP 10 is moved between an unloading position that is a backward position and a loading position that is a forward position. In FIGS. 4 and 5, there is illustrated a state in which the FOUP 10 is located at the unloading position. The FOUP 10 is mounted onto the stage 42 in the unloading position in a state where the grip portion 25 is gripped by an appropriate transfer unit. Then, the stage 42 is moved forward and the FOUP 10 and the normal pressure transfer chamber 8 are connected at the loading position. Accordingly, the wafer W can be transferred by the transfer unit 16.

As shown in FIG. 5, an opening is formed at an outer wall 8a of the normal pressure transfer chamber 8 to correspond to the wafer transfer port 40. A frame 46 having an opening is attached to the outer portion of the opening of the outer wall 8a through a seal member 45. An inner periphery of the opening of the frame 46 serves as the wafer transfer port 40. The door 43 is brought into close contact with the frame 46 through a seal member 47, thereby closing the wafer transfer port 40. When the door 43 is switched from a closed state to an open state, the door 43 is horizontally moved toward the inside of the normal pressure transfer chamber 8 and then moved downward by a driving unit (not shown).

The latch keys 48 are provided at a surface of the door 43 which faces the FOUP 10. As the FOUP 10 mounted on the stage 42 is moved forward and backward together with the stage 42, the latch keys 48 are engaged into and disengaged from the key holes 28 (see FIG. 2) of the cover 22. The door 43 has an attracting unit (not shown) for attracting the cover 22 of the FOUP 10.

As shown in FIGS. 5 and 6, on the surface of the stage 42, kinematic pins 49 that are protrusions for positioning the FOUP 10 are provided to correspond to the recesses 30 of the FOUP 10. The stage 42 is provided with a clamp unit (not shown) for performing clamping at the time of positioning the FOUP 10. Through holes 50 are formed at the stage 42 to correspond to the gas exhaust outlet 37 and the gas supply inlets 31 formed at the FOUP 10. Gas supply connectors 51 are provided at the base 41 to correspond to the gas supply inlets 31 of the FOUP 10 at the time of locating the stage 42 at the loading position. The gas supply connectors 51 are connected to one end of a flexible gas supply line 52. The other end of the gas supply line 52 is connected to a gas supply source 53. A dry purge gas, e.g., $N_2$ gas, can be supplied through the gas supply line 52. Notations V1 to V3 in FIG. 6 denote valves.

The gas supply connectors 51 are configured to be raised and lowered by an elevation unit (not shown) such as an air cylinder or the like. An annular seal member (not shown) is provided at a leading end of each of the gas supply connectors 51. By raising the gas supply connectors 51, the gas supply connectors 51 are aligned with the gas supply inlets 31 of the FOUP 10 so that the purge gas can be supplied into the FOUP 10.

A gas exhaust connector 54 is provided at the base 41 to correspond to a through hole 50 formed at a right front side of the stage 42 located at the loading position. The gas exhaust connector 54 is a cylinder body having an open top and a bottom. A gas exhaust line 55 is connected to the gas exhaust connector 54. The gas exhaust connector 54 is configured to be raised and lowered by an elevation unit (not shown) such as an air cylinder or the like. An annular seal member (not shown) is provided at a leading end of the gas exhaust connector 54. By raising the gas exhaust connector 54, the exhaust connector 54 is aligned with the gas exhaust outlet 37 of the FOUP 10 so that the FOUP 10 can be exhausted.

The gas supply connectors 51, the gas supply line 52, the gas exhaust connector 54, and the gas exhaust line 55 constitute a gas exhaust/purge unit.

The frame 46 serves as a member for maintaining airtightness of the door 43 by using the seal member 47 and also serves as a gas exhaust/supply ring. A gas exhaust/supply groove 61 is formed at an inner peripheral surface of the frame 46. The gas exhaust/supply groove 61 is connected to a first transfer port exhaust line 62, a transfer port purge gas line 63, and a communication line 64 communicating with the normal pressure transfer chamber 8. The communication line 64 is connected to the gas exhaust/supply groove 61 through the first transfer port exhaust line 62. The first transfer port exhaust line 62 is provided with a valve V4. The transfer port purge line 63 is provided with a valve V5. The communication line 64 is provided with a communication valve V6.

A gas exhausting groove 65 is formed at a central portion of a surface of the door 43 which faces the FOUP 10. A second transfer port exhaust line 66 is connected to the gas exhausting groove 65. The second transfer port exhaust line 66 is provided with a valve V7.

A seal member 71 to be in close contact with the cover 22 of the FOUP 10 is provided at the surface of the door 43 which faces the FOUP 10. A seal member 72 to be in close contact with the main body 20 of the FOUP 10 is provided at a surface of the frame 46 which faces the FOUP 10. A seal member 22a is provided between the main body 20 of the FOUP 10 and the cover 22 and seals a space therebetween.

When the FOUP 10 is docked to the door 43 by moving the stage 42 toward the normal pressure transfer chamber 8, the airtightness of the space between the FOUP 10 and the door 43 and that of the space between the door 43 and the frame 46 are obtained. This is because the seal member 47 is provided between the frame 46 and the door 43 and the seal members 71 and 72 are provided between the door 43 and the cover 22 of the FOUP 10 and between the frame 46 and the main body 20 of the FOUP 10, respectively, as shown in FIG. 7. The sealed spaces thus formed can be exhausted and purged.

The following is description of operations of the load port 11 as the connecting mechanism configured as described above.

Figure 8:
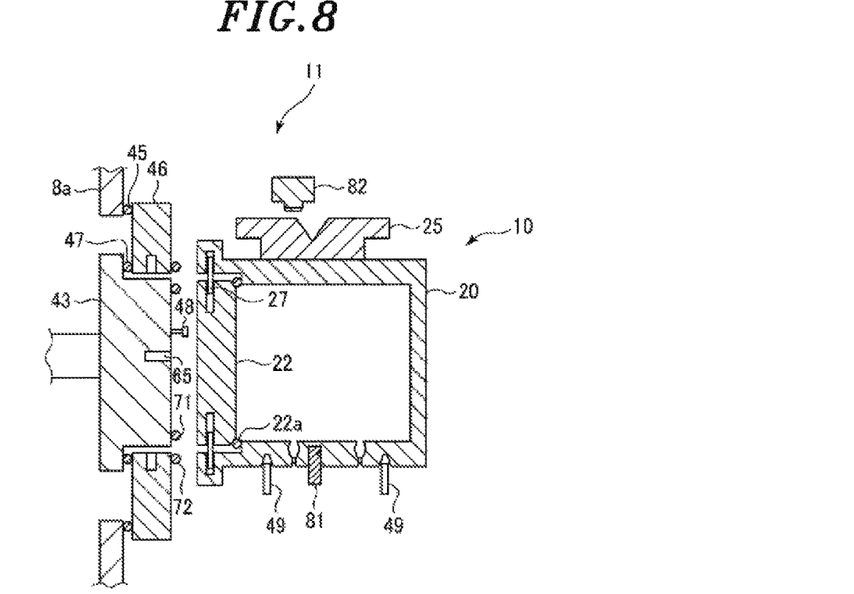
FIGS. 8 to 15 are views for explaining an operation of the load port as the connecting mechanism according to the embodiment.

First, as shown in FIG. 8, the FOUP 10 that is a wafer container accommodating, e.g., 25 wafers W, is mounted on the stage 42 located at the unloading position by the transfer unit. Then, the FOUP 10 is positioned by the three kinematic pins 49 provided on the stage 42 and clamped by a clamp member 81. At this time, the cover 22 and the main body 20 of the FOUP 10 are locked by the linearly moving part 27.

Figure 9:
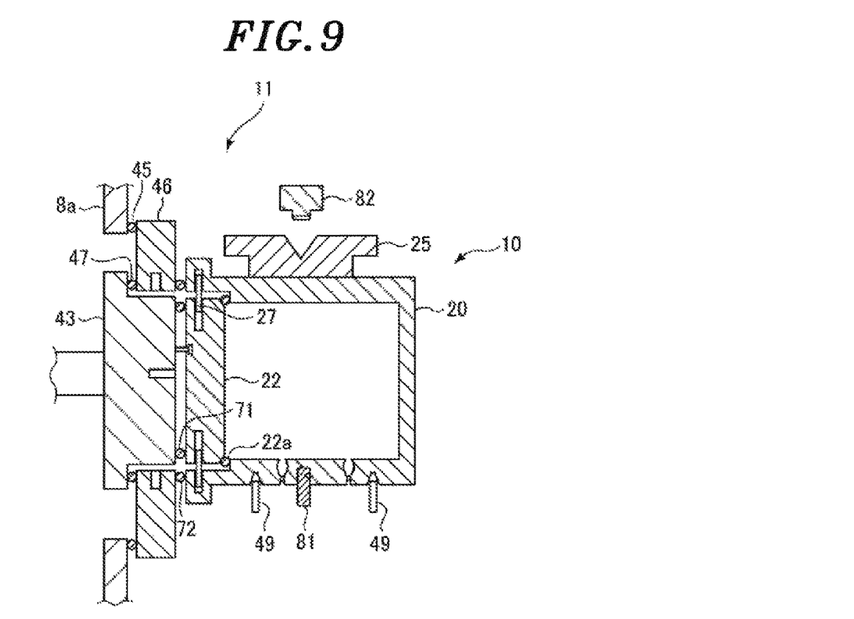
Figure 10:
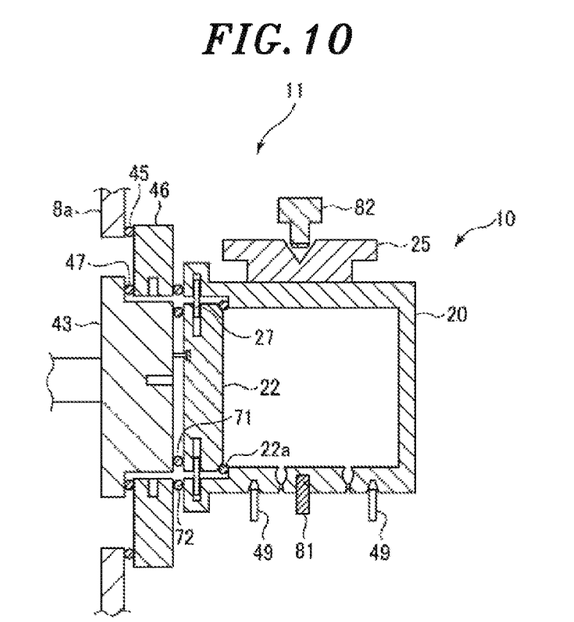

Next, as shown in FIG. 9, the stage 42 is moved toward the transfer port 40, and the cover 22 of the FOUP 10 is docked to the door 43. Next, as shown in FIG. 10, a clamp member 82 is inserted into the clamp groove 25a formed at the grip portion 25 of the FOUP 10 and, then, the FOUP 10 is fixed so as not to be deviated by the pressure in the normal pressure transfer chamber 8. If the possibility of deviation of the FOUP 10 is low, the clamping by the clamp member 82 may be omitted.

Figure 11:
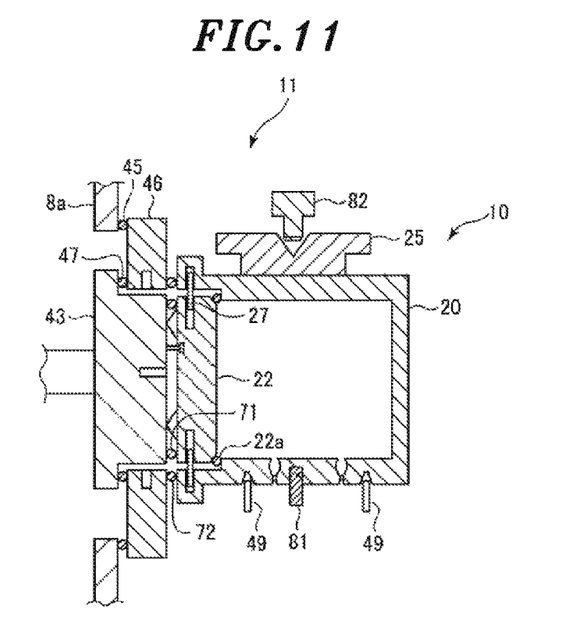

Thereafter, as shown in FIG. 11, the cover 22 of the FOUP 10 is attracted to the door 43 by an attracting unit (not shown). As such, the stage moving unit (not shown), the latch keys 48, the Key holes 28, the clamp member 82 and the attracting unit (not shown) may constitute a coupling mechanism which couples the cover 22 of the FOUP 10 with the door 43.

Figure 12:
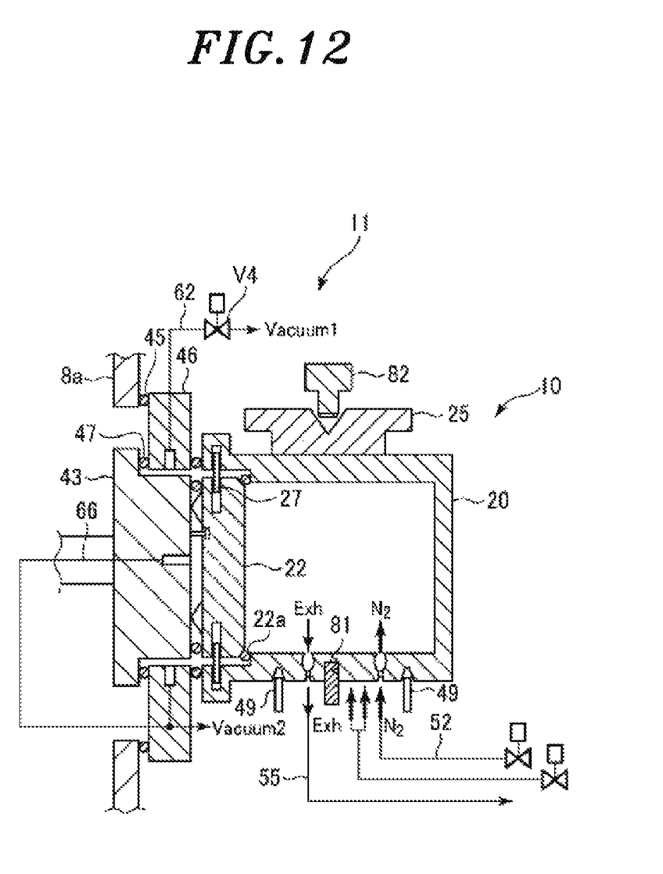

Next, the gas supply connectors 51 and the gas exhaust connector 54 are raised. As shown in FIG. 12, the FOUP 10 is exhausted through the gas exhaust connector 54 and the gas exhaust line 55 and, at the same time, the purge gas such as a dry nitrogen gas or the like is supplied into the FOUP 10 through the gas supply line 52 and the gas supply connectors 51 to thereby purge the inside of the FOUP 10. At this time, by opening the valves V4 and V7 of the first and the second transfer port gas exhaust line 62 and 66 (Vacuum1 and Vacuum2), the purge gas (nitrogen gas) supplied into the FOUP 10 leaks from the gaps of the seal members 22a, 71 and 72 and is supplied to the spaces sealed by the seal members 47, 71 and 72, i.e., the space between the door 43 and the frame 46 (transfer port 40) and the space between the door 43 and the cover of the FOUP 10. Therefore, gases in these spaces are also replaced by the purge gas (nitrogen gas). Accordingly, oxygen gas or moisture and particles can be discharged from the space in the FOUP 10, the space between the door 43 and the frame 46 (transfer port 40), and the space between the door 43 and the cover of the FOUP 10. Further, the inside of the door 43 can be purged.

Figure 13:
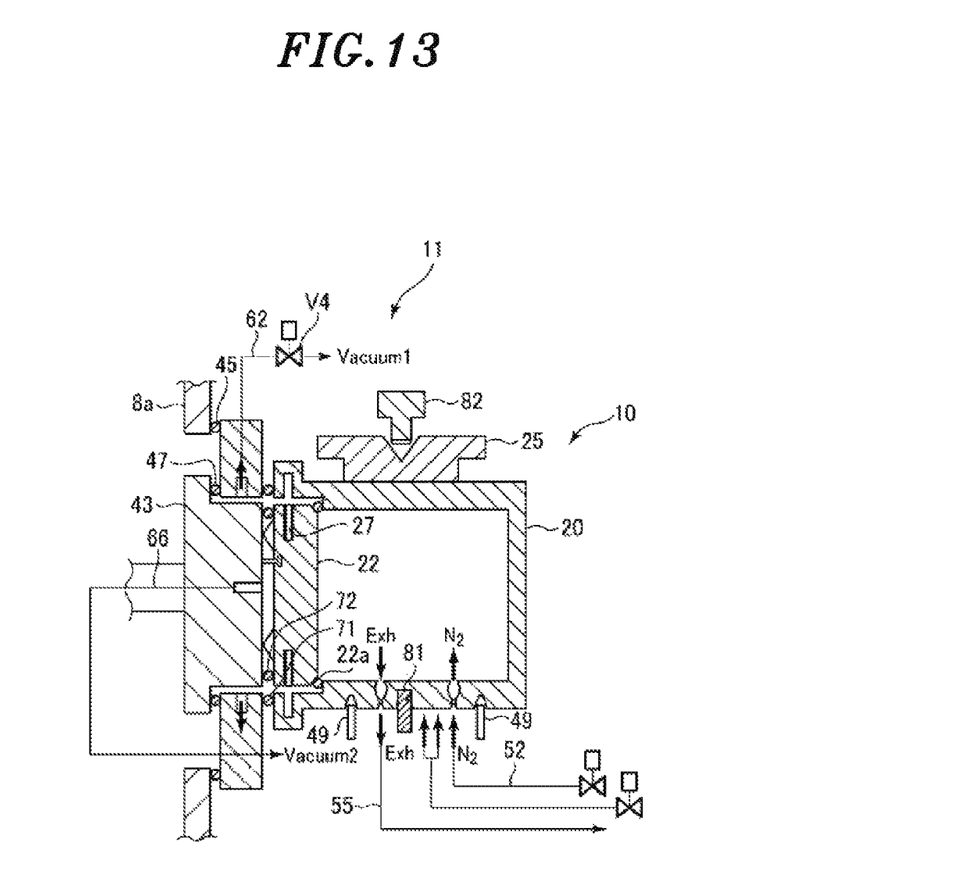

Next, as shown in FIG. 13, the linearly moving part 27 is retreated and the locking between the cover 22 and the main body 20 of the FOUP 10 is released. At this time, the exhaust through the first and the second transfer port exhaust line 62 and 66 (Vacuum1 and Vacuum2) is continued and generated particles are sucked.

Figure 14:
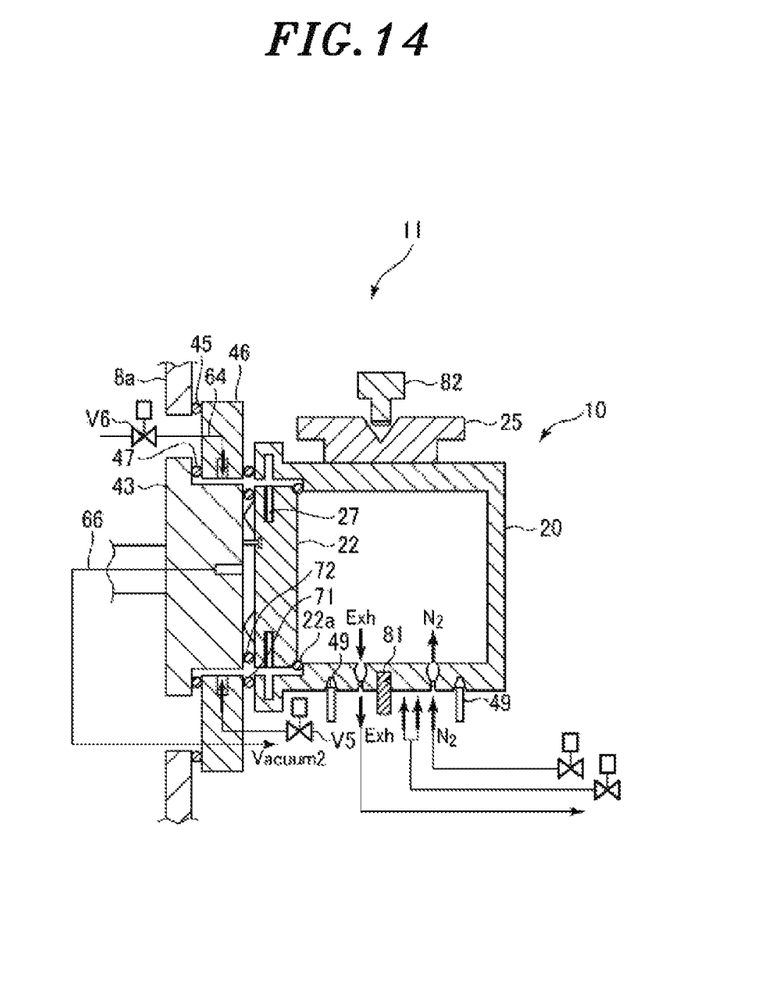

Next, a purge gas is supplied into the space between the door 43 and the frame 46 by a purge gas supply mechanism. For example, as shown in FIG. 14, the purge gas (nitrogen gas) is supplied into the space between the door 43 and the frame 46 (transfer port 40) and the inside of the door 43 through the gas exhaust/supply groove 61 by closing the valve V4 of the first transfer port exhaust line 62 (Vacuum1) and opening the valve V5 of the transfer port purge gas line 63. After the supply of the purge gas is continued for a predetermined period of time, the supply of the purge gas from the transfer port purge gas line 63 is stopped by closing the valve V5. As such, the gas exhaust/supply groove 61, the transfer port purge gas line 63 and the valve V5 may constitute the purge gas supply mechanism. The pressure at this time satisfies the following relation: the normal pressure transfer chamber<the space sealed by the seal member and the inside of the door<the FOUP. In that state, the supply of the purge gas (nitrogen gas) into the FOUP 10 is stopped by closing the valves (V1, V2 and V3) and the space between the door 43 and the frame 46 (transfer port 40) is allowed to communicate with the space of the normal pressure transfer chamber 8 by opening the communication valve V6. At this time, the pressure satisfies the following relation: the normal pressure transfer chamber=the space sealed by the seal member and the inside of the door<the FOUP. Accordingly, the door 43 can be opened.

Figure 15:
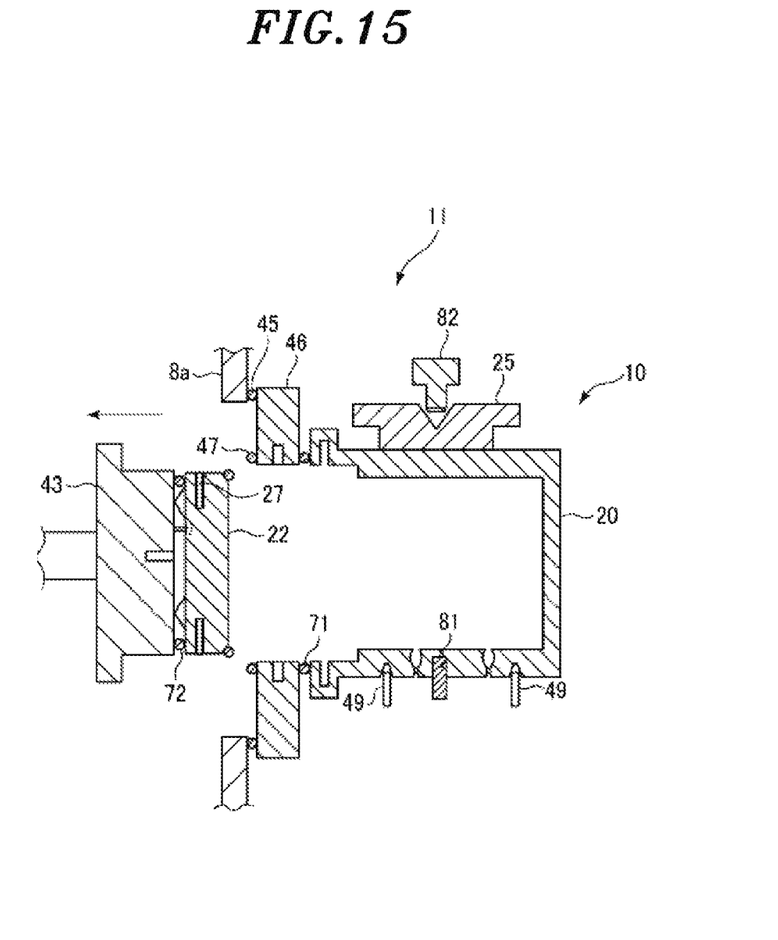

Then, as shown in FIG. 15, the door 43 is moved into the normal pressure transfer chamber 8 together with the cover of the FOUP 10 by a driving unit (not shown), and the transfer port 40 is opened. Accordingly, the FOUP 10 and the normal pressure transfer chamber 8 communicate with each other, and the transfer unit 16 in the normal pressure transfer chamber 8 can unload the wafer W from the FOUP 10 and return the wafer W in the load-lock chamber 6 into the FOUP 10.

As described above, in the present embodiment, in the load port 11 for connecting the FOUP 10 that is a wafer container to the normal pressure transfer chamber 8 where the purge gas is circulated, when the FOUP 10 is mounted on the stage 42 as a mounting unit and the cover 22 of the FOUP 10 is docked to the door 43, the inside of the FOUP 10 can be purged by the purge gas. Further, the space between the cover 22 of the FOUP 10 and the door 43 and the space between the outer periphery of the door 43 and the frame 46 forming the wafer transfer port 40 can be sealed by the seal members 47, 71 and 72 and purged and exhausted. Therefore, the sealed spaces can be purged by the purge gas supplied into the FOUP 10, and oxygen gas or moisture and particles can be discharged from these spaces. At this time, the inside of the door 43 can also be purged, so that particles generated in the door 43 can be discharged. Thus, when the FOUP 10 is connected to the normal pressure transfer chamber 8 by the load port 11, it is possible to suppress inflow of air (oxygen gas or moisture) and particles into the normal pressure transfer chamber 8 which is being purged by the purge gas.

Since the inside of the FOUP 10 and the inside of the normal pressure transfer chamber 8 are purged by the same purge gas (e.g., nitrogen gas), the pressure in the FOUP 10 can become equal to that in the normal pressure transfer chamber 8 simply by allowing the normal pressure transfer chamber 8 to communicate with the door 43 through the communication line 64 by opening the communication valve V6. Accordingly, the door 43 can be opened.

Since the pressure can be simply controlled as described above, the door 43 as a single member can be sealed by the seal member 47 to the frame 46 forming the peripheral portion of the wafer transfer port 40 without dividing the door 43 into a door main body and a support part for supporting the cover of the FOUP 10. Accordingly, the structure can be simplified and the scaling down can be realized.

Other Applications

The present disclosure is not limited to the above embodiments and may be variously modified within the scope of the present disclosure. For example, in the above embodiments, the peripheral portion of the wafer transfer port 40 is formed by the frame 46, and the frame 46 and the wall 8a of the normal pressure transfer chamber are separately provided. However, the wall 8a of the normal pressure transfer chamber and the frame 46 may be formed integrally.

The configuration of the load port is not limited to that described in the above embodiments and may vary as long as it is possible to purge the FOUP in a state where the cover of the FOUP is docked to the door for opening/closing the wafer transfer port and also possible to seal, purge and exhaust the space between the cover of the FOUP and the door and the space around the outer periphery of the door.

In the above embodiments, the present disclosure is applied to the processing system for performing vacuum processing. However, the present disclosure may also be applied to a processing system for performing atmospheric processing, such as a coating/developing apparatus for performing resist coating and developing on a wafer, a cleaning apparatus or the like.

In the above embodiments, the present disclosure is used for processing a semiconductor wafer. However, the present disclosure may also be used for processing other substrates such as a flat panel display substrate and the like.

While the disclosure has been shown and described with respect to the embodiments, it will be understood by those skilled in the art that various changes and modifications may be made without departing from the scope of the disclosure as defined in the following claims.

What is claimed is:

1. A connecting mechanism for a substrate container including a main body for accommodating a plurality of substrates and a cover for opening/closing an opening of the main body, which connects the substrate container to a normal pressure transfer chamber in which a purge gas circulates and which is configured to transfer a substrate to a processing unit for processing a substrate, the connecting mechanism comprising:
   a mounting unit configured to mount thereon the substrate container;
   a substrate transfer port provided at a wall of the normal pressure transfer chamber;
   a door configured to close the substrate transfer port and open the substrate transfer port by moving toward the normal pressure transfer chamber side;
   a coupling mechanism configured to couple the cover of the substrate container mounted on the mounting unit with the door;
   a gas exhaust/purge unit configured to exhaust the substrate container while supplying a purge gas into the substrate container in a state where the substrate container is coupled with the door;
   a first seal member configured to seal a first space between a peripheral portion of the substrate transfer port and the door when the door closes the substrate transfer port;
   a second seal member configured to seal a second space between the door and the cover of the substrate container when the substrate container is coupled with the door;
   a third seal member configured to seal a third space between the peripheral portion of the substrate transfer port and the main body of the substrate container when the substrate container is coupled with the door; and
   a gas exhaust unit configured to exhaust the first space and the second space which are sealed by the first to the third seal member,
   wherein the purge gas, which has been supplied into the substrate container by the gas exhaust/purge unit, is supplied into the first and the second space by allowing the gas exhaust unit to exhaust the first and the second space.

2. The connecting mechanism of claim 1, wherein the gas exhaust unit comprises:
   a first gas exhaust unit configured to exhaust the first space; and
   a second gas exhaust unit configured to exhaust the second space.

3. The connecting mechanism of claim 2, wherein the peripheral portion of the substrate transfer port is formed by a frame provided separately from the wall of the normal pressure transfer chamber, the frame and the door are sealed by the first seal member, and a gas exhausting groove of the first gas exhaust unit is formed at an inner periphery of the frame.

4. The connecting mechanism of claim 2, wherein a gas exhausting groove is formed at a surface of the door which faces the substrate container and the second gas exhaust unit exhausts the second space through the gas exhausting groove.

5. The connecting mechanism of claim 1, further comprising:

a communication line configured to allow the normal pressure transfer chamber to communicate with the first space; and a communication valve provided in the communication line.

6. The connecting mechanism of claim 1, further comprising:

a purge gas supply mechanism configured to supply the purge gas into the first space.

7. A connecting method for a substrate container including a main body for accommodating a plurality of substrates and a cover for opening/closing an opening of the main body, which connects the substrate container to a normal pressure transfer chamber in which a purge gas circulates and which is configured to transfer a substrate to a processing unit for processing a substrate, the method comprising:

closing a substrate transfer port provided at a wall of the normal pressure transfer chamber by a door;

coupling the cover of the substrate container with the door;

sealing a space between a peripheral portion of the substrate transfer port and the door, a space between the door and the cover of the substrate container and a space between the peripheral portion of the substrate transfer port and the main body of the substrate container;

exhausting the substrate container while supplying a purge gas into the substrate container in a state where the substrate container is coupled with the door; and supplying the purge gas which has been supplied into the substrate container into the sealed spaces by exhausting the sealed spaces.

8. The method of claim 7, wherein after the sealed spaces are exhausted and purged, the exhaust of the sealed spaces is stopped and a pressure in the door and a pressure in the normal pressure transfer chamber are made equal to each other by allowing an inside of the door to communicate with the normal pressure transfer chamber, and then the substrate transfer port is opened by moving the door toward the normal pressure transfer chamber side.

9. The method of claim 7, wherein the exhaust of the sealed spaces are individually performed in a first space between the door and the peripheral portion of the substrate transfer port and in a second space between the door and the cover of the substrate container.

10. The method of claim 9, wherein after the first and the second space are exhausted and purged, the exhaust of the first space is stopped and the purge gas is supplied into the first space and, then, the exhaust of the second space and the supply of the purge gas into the first space are stopped and, then, a pressure in the door and a pressure in the normal pressure transfer chamber are made equal to each other by allowing an inside of the door to communicate with the normal pressure transfer chamber and, then, the substrate transfer port is opened by moving the door toward the normal pressure transfer chamber side.

\* \* \* \* \*